(12) United States Patent
Kuo et al.

(10) Patent No.: US 8,768,994 B2
(45) Date of Patent: Jul. 1, 2014

(54) FILTER AUTO-CALIBRATION USING MULTI-CLOCK GENERATOR

(75) Inventors: Feng Wei Kuo, Zhudong Township (TW); Mei-Show Chen, Hsinchu (TW); Chewn-Pu Jou, Hsinchu (TW); Ying-Ta Lu, Fanlu Township (TW); Jia-Liang Chen, Zhubei (TW)

(73) Assignees: Taiwan Semiconductor Manufacturing Company, Ltd. (TW); Global Unichip Corp. (TW)

( * ) Notice: Subject to any disclaimer, the term of this patent is extended or adjusted under 35 U.S.C. 154(b) by 865 days.

(21) Appl. No.: 12/910,232

(22) Filed: Oct. 22, 2010

(65) Prior Publication Data

US 2012/0098592 A1    Apr. 26, 2012

(51) Int. Cl.
G06F 17/10    (2006.01)
H04N 5/50    (2006.01)
H04L 27/06    (2006.01)
H04B 1/18    (2006.01)

(52) U.S. Cl.
USPC ......... 708/300; 348/735; 375/344; 455/192.2

(58) Field of Classification Search
USPC .......... 348/725–735; 375/316, 344, 346, 350; 455/130, 150.1–200.1, 205–216, 455/230–268, 296, 302, 307, 310–312, 455/334; 708/300–323
See application file for complete search history.

(56) References Cited

U.S. PATENT DOCUMENTS

| | | | |
|---|---|---|---|
| 6,229,399 B1 * | 5/2001 | Tobise et al. ................... 331/17 |
| 7,425,995 B2 * | 9/2008 | Johnson ........................ 348/725 |
| 7,680,227 B2 * | 3/2010 | Kavadias et al. .............. 375/354 |
| 7,773,965 B1 * | 8/2010 | Van Brunt et al. ......... 455/226.1 |
| 7,825,703 B2 * | 11/2010 | Qiao et al. ..................... 327/117 |
| 8,040,996 B2 * | 10/2011 | Zolfaghari .................... 375/376 |
| 8,120,394 B2 * | 2/2012 | Tarng et al. ................... 327/156 |
| 8,344,765 B2 * | 1/2013 | Qiao et al. ..................... 327/118 |
| 2005/0008107 A1 * | 1/2005 | Brown ........................... 375/343 |
| 2005/0048939 A1 * | 3/2005 | McMullin et al. ......... 455/189.1 |
| 2006/0238226 A1 * | 10/2006 | Holland et al. ................ 327/115 |
| 2007/0080835 A1 * | 4/2007 | Maeda et al. .................. 341/120 |
| 2007/0207760 A1 * | 9/2007 | Kavadias et al. .............. 455/255 |
| 2008/0002597 A1 * | 1/2008 | Fan et al. ....................... 370/280 |
| 2008/0070539 A1 * | 3/2008 | He et al. ........................ 455/305 |

(Continued)

OTHER PUBLICATIONS

S. Saeedi and M. Atarodi, "Single-VCO multi-band DTV frequency synthesizer with a divide-by-3 frequency divider for quadrature signal generation," Analog Integr. Circuits Signal Process. vol. 64, No. 2, pp. 103-113, Aug. 2010.*

(Continued)

*Primary Examiner* — Chuong D Ngo
*Assistant Examiner* — Matthew Sandifer
(74) *Attorney, Agent, or Firm* — Lowe Hauptman & Ham, LLP

(57) ABSTRACT

A filter auto-calibration system includes a multi-clock module. The multi-clock module includes a multi-clock generator that is configured to generate a clock signal with a variable frequency based on a channel setting. There is at least one filter to be calibrated. An auto-calibration control module is configured to control calibration of the at least one filter based on the channel setting. The multi-clock module is configured to supply the variable frequency clock signal to the at least one filter and to the auto-calibration control module, and the at least one filter is coupled to the auto-calibration control module.

20 Claims, 5 Drawing Sheets

(56) References Cited

U.S. PATENT DOCUMENTS

| | | | |
|---|---|---|---|
| 2008/0136535 A1* | 6/2008 | Khorram | 331/17 |
| 2008/0157823 A1* | 7/2008 | Yu et al. | 327/105 |
| 2009/0054007 A1* | 2/2009 | Kawabe et al. | 455/76 |
| 2009/0074120 A1* | 3/2009 | Toosky et al. | 375/350 |
| 2009/0181631 A1* | 7/2009 | Darabi et al. | 455/258 |
| 2009/0261910 A1* | 10/2009 | Locker | 331/34 |
| 2009/0325521 A1* | 12/2009 | Dubash et al. | 455/150.1 |
| 2010/0046693 A1* | 2/2010 | Ellersick | 377/47 |
| 2010/0085490 A1* | 4/2010 | Chen | 348/725 |
| 2010/0151806 A1* | 6/2010 | Firoiu et al. | 455/192.2 |
| 2010/0167683 A1* | 7/2010 | McMullin et al. | 455/326 |
| 2010/0173598 A1* | 7/2010 | Kavadias et al. | 455/226.1 |
| 2010/0233971 A1* | 9/2010 | Vassiliou et al. | 455/73 |
| 2011/0032011 A1* | 2/2011 | Kim et al. | 327/156 |
| 2011/0081877 A1* | 4/2011 | Seendripu et al. | 455/196.1 |
| 2011/0241797 A1* | 10/2011 | Shana'a et al. | 333/174 |
| 2011/0279175 A1* | 11/2011 | Kuo et al. | 327/553 |
| 2012/0303688 A1* | 11/2012 | Kuo | 708/1 |

OTHER PUBLICATIONS

S. Tarng, J. Peng, T. Chueh, and M. Kuo, "An automatic frequency calibration technique for fractional-N frequency synthesizers," 2010 Proceedings of the ESSCIRC, pp. 154,157, Sep. 2010.*

M. Marutani, H. Anbutsu, M. Kondo, et al., "An 18mW 90 to 770MHz Synthesizer with Agile Auto-Tuning for Digital TV-Tuners," ISSCC Dig. Tech. Papers, pp. 192-193, Feb. 2006.*

Heping, Ma et al., "A Mutli-Standard Active-RC Filter With Accurate Tuning System", 2009 Chinese Institute of Electronics, vol. 30, No. 9, Journal of Semiconductors, Sep. 2009.

Vassiliou, Iason, et al., "A 65 nm CMOS Multistandard, Multiband TV Tuner for Mobile and Multimedia Applications", IEEE Journal of Solid-State Circuits, vol. 43, No. 7, Jul. 2008.

* cited by examiner

FILTER AUTO-CALIBRATION USING MULTI-CLOCK GENERATOR

CROSS-REFERENCES TO RELATED APPLICATIONS

The present application is related U.S. application Ser. No. 12/777,293, now U.S. Pat. No. 8,314,652, entitled "SYSTEM AND METHOD FOR RC CALIBRATION USING PHASE AND FREQUENCY" filed on May 11, 2010, which is incorporated herein by reference.

BACKGROUND

A clock generator is used for a filter auto-calibration in many receiver applications, e.g., Digital Video Broadcasting, Handheld (DVB-H), Global Positioning System (GPS), Wireless Local Area Network (WLAN), etc. The receiver needs to obtain an accurate clock frequency for its filter auto-calibration. In some methods, noise in the generated clock signal is a problem, while a large current consumption and chip area usage are problems in other methods. Also, Process, Voltage, and/or Temperature (PVT) variations can incur high mass testing cost.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
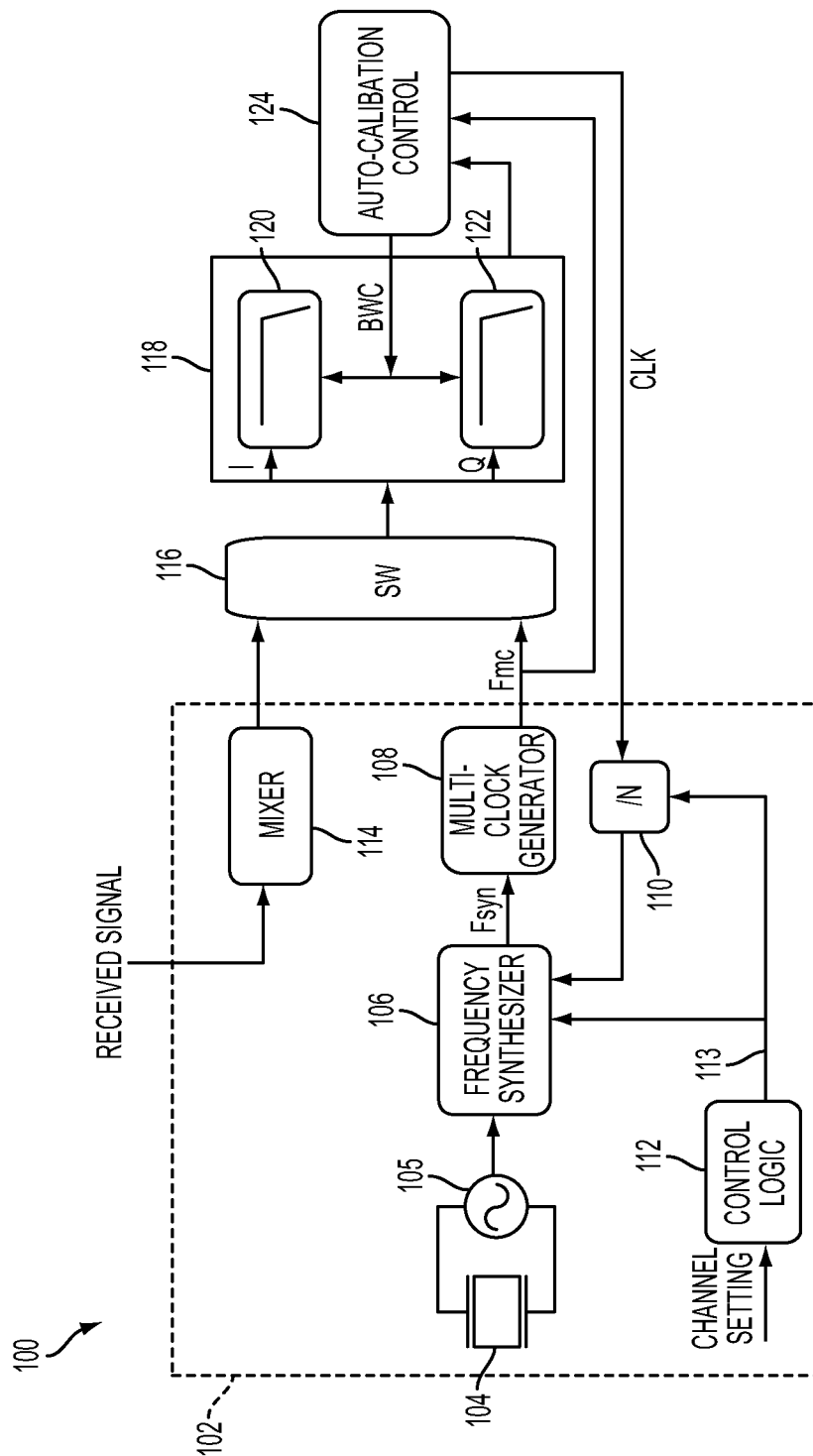
FIG. 1 is a schematic diagram showing an exemplary filter auto-calibration system using a multi clock generator according to some embodiments.

FIG. 1 is a schematic diagram showing an exemplary filter auto-calibration system 100 using a multi clock generator according to some embodiments. The filter auto-calibration system 100 includes a multi-clock module 102, a switch module 116, a filter module 118, and an auto-calibration control module 124.

Figure 2:
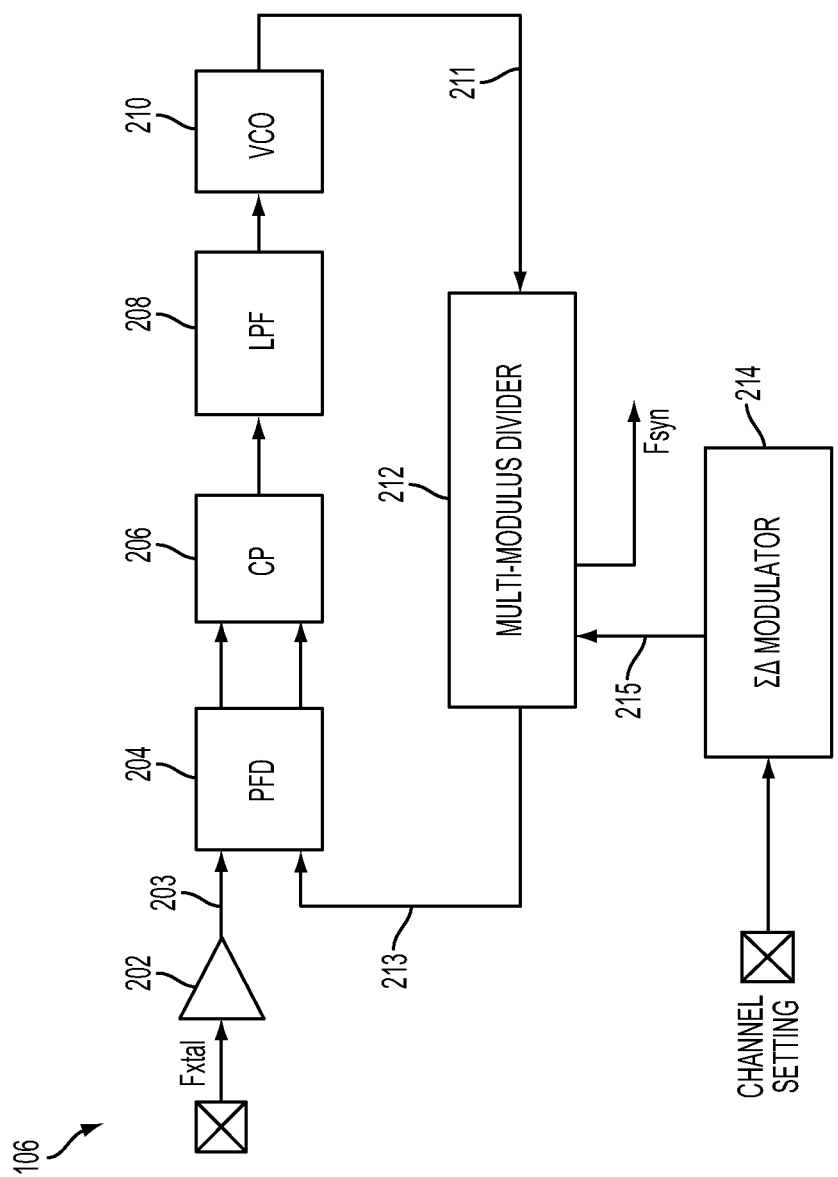
FIG. 2 is a schematic diagram showing an exemplary Sigma-Delta (ΣΔ) Fractional-N Frequency Synthesizer for the filter auto-calibration system of FIG. 1 according to some embodiments.

The multi-clock module 102 includes a crystal 104, an oscillator 105, a frequency synthesizer 106, a multi-clock generator 108, a divider-by-N 110, a control logic circuit 112, and a mixer 114. The frequency synthesizer 106 can be a Sigma-Delta (ΣΔ) fractional-N frequency synthesizer as shown in FIG. 2, for example. The frequency synthesizer 106 is configured to generate a frequency signal (Fsyn) based on a clock-timing signal, such as the output of the oscillator 105, and on a control input signal 113. The divider-by-N 110 divides the clock signal CLK from the auto-calibration control module 124 by a factor of N to be supplied to the frequency synthesizer 106, where N is a positive number.

A control logic circuit 112 (that can include a table in a memory, such as a Read-Only Memory (ROM) or a Random Access Memory (RAM)), receives a channel setting signal from outside and provides a control input signal 113 for the frequency synthesizer 106 and the divider-by-N 110, based on the channel setting signal. The frequency synthesizer 106 generates the frequency signal Fsyn that may be independent of the crystal frequency, such as the crystal 104, for example. Since the frequency synthesizer 106 may enable fractional synthesis, the multi-clock module 102 may utilize the same crystal utilized by other operations in a system, e.g., a mobile terminal.

The mixer 114 generates an in-phase (I) and a quadrature (Q) component of a quadrature signal from the received (baseband frequency) signal, where the quadrature signal's I and Q components have 90 degrees separation between them. The switch module 116 connects quadrature components (I and Q) from either the multi-clock generator 108's output (Fmc) or the mixer 114. For example, when the filter auto-calibration system 100 is in an auto-calibration mode, the multi-clock generator 108 is connected to the filter module 118. When the auto-calibration is complete, then the mixer 114 can be connected to the filter module 118.

The filter module 118 has an in-phase signal (I) filter 120, and a quadrature (Q) filter 122. For example, the (baseband) filters 120 and 122 may comprise Resistor-Capacitor (RC) filters to be calibrated. During auto-calibration, I and Q components of the multi-clock generator 108's output Fmc is connected to the I filter 120 and Q filter 122, respectively. The auto-calibration control module 124 receives output signals from the filter module 118 (i.e., I filter 120 and/or Q filter 122) and the multi-clock generator 108, and generates a bandwidth code (BWC) that indicates a reference value for calibration of the filter module 118. In some embodiments, the filter module 118 has a configurable capacitor that is modified according to the BWC to change the bandwidth of the filter 120 and/or 122. In some embodiments, the filter auto-calibration system 100 can be applied on one signal path, e.g., either the in-phase signal (I), or the quadrature signal (Q) path. More details about the operations of the auto-calibration control module 124 are described below for FIG. 4.

FIG. 2 is a schematic diagram showing an exemplary Sigma-Delta (ΣΔ) Fractional-N Frequency Synthesizer ("synthesizer") 106 for the filter auto-calibration system of FIG. 1 according to some embodiments. The synthesizer 106 may receive a reference frequency (Fxtal) signal from the crystal 104 via an oscillator 105, for example. The Fxtal signal (e.g., 10-40 MHz in some applications) is buffered (by a buffer 202) before input to a Phase Frequency Detector (PFD) 204.

The PFD 204 detects and compares the phase and frequency information of the buffered signal 203 (of Fxtal signal) and an output 213 from a Multi-Modulus Divider (MMD) 212. PFD 204 also controls a Charge Pump (CP) 206 (that changes CP output voltage) based on the information. The CP output is passed through a low pass filter 208 to reduce high frequency noise, before being connected to the Voltage Controlled Oscillator (VCO) 210 to control the VCO operation. For example, higher voltage from the CP output may increase the frequency of VCO output depending on implementations.

The output 211 of the VCO, e.g., a 2.4-4 GHz signal, is further divided by MMD 212 to generate Fsyn signal, e.g., a 100-300 MHz signal. The MMD 212 divides the signal 211 by a number based on a channel setting signal, and comprises multiple high-speed D flip-flops in some implementations. The channel setting signal, e.g., a 20-bit signal, is passed through a ΣΔ modulator 214 to be quantized into a MMD setting signal 215, e.g., −3-+4. The MMD setting signal 215 controls the division number of MMD 212, which can be a number, e.g., in the range of 64-511 for some applications. The Fsyn signal can be turned on during an auto-calibration process, and turned off after the auto-calibration process, by using a multiplexer (MUX) or a switch (not shown) in the MMD 212.

While the (ΣΔ Fractional-N) Frequency Synthesizer 106 in FIG. 2 is described for the filter auto-calibration system 100 in FIG. 1, other sources of frequency signal Fsyn can be used, e.g., a phase locked loop (PLL) present in a communication receiver.

Figure 3:
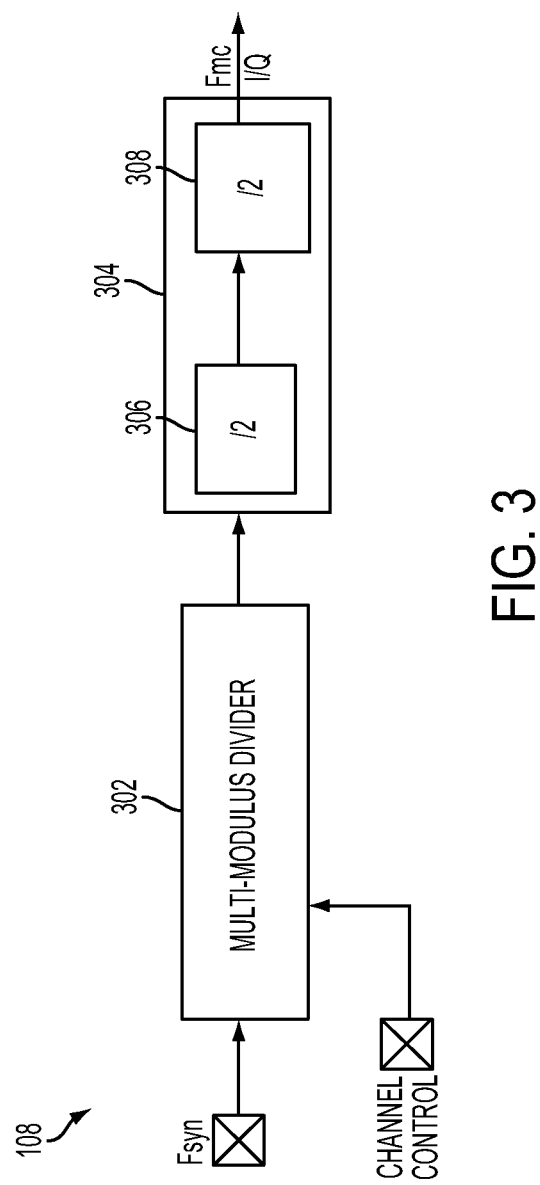
FIG. 3 is a schematic diagram showing an exemplary multi-clock generator (MCG) for the filter auto-calibration system in FIG. 1 according to some embodiments.

FIG. 3 is a schematic diagram showing an exemplary Multi-Clock Generator for (MCG) 108 for the filter auto-calibration system in FIG. 1 according to some embodiments. The Fsyn signal from the synthesizer 106 is input to another Multi-Modulus Divider (MMD) 302 (comprising multiple high speed D flip-flops in some implementations) that further divides Fsyn signal by a number controlled by the channel setting signal, to output (supply) the Fmc signal. The division number of MMD 302 can be a number, e.g., in the range of 2-17 for some applications. The output from MMD 302 is sent to a quadrature module 304 that generates quadrature (I and Q) signals of Fmc (that can be sent to the filter module 118 and auto-calibration control module 124 in FIG. 1). For example, the in-phase (I) signals have phases at 0 and 180 degrees, and quadrature (Q) signals have phases at 90 and 270 degrees.

The quadrature module 304 includes two dividers (i.e., divider-by-2) 306 and 308. The first divider 306 divides its input by 2 and produces a signal having a 50% duty cycle to avoid calibration mismatch. The second divider 308 divides its input by 2 to produce quadrature (I and Q) signals. The dividers can be implemented using various known circuits, e.g., Current Mode Logic (CML), True Single Phase Clock (TSPC), injection locking divider, or all digital divider-by-2. An all digital divider-by-2 may have less area and power consumption than other circuits depending on implementations. In some embodiments, other blocks, e.g., a divide-by-4 using a toggle flip-flop, can be used to produce the quadrature signals.

The MCG 108 provides a wider range of frequency signals by using the MMD 302 with a variable division ratio controlled by the channel setting signal, e.g., from 2 to 17. Due to MCG 108's flexibility to adjust the frequency signal Fmc for auto-calibration of many filters for many applications, more accurate filter (bandwidth) calibration is possible despite local PVT variations. Mass-testing time, as well as current/area consumption, can be reduced.

Figure 4:
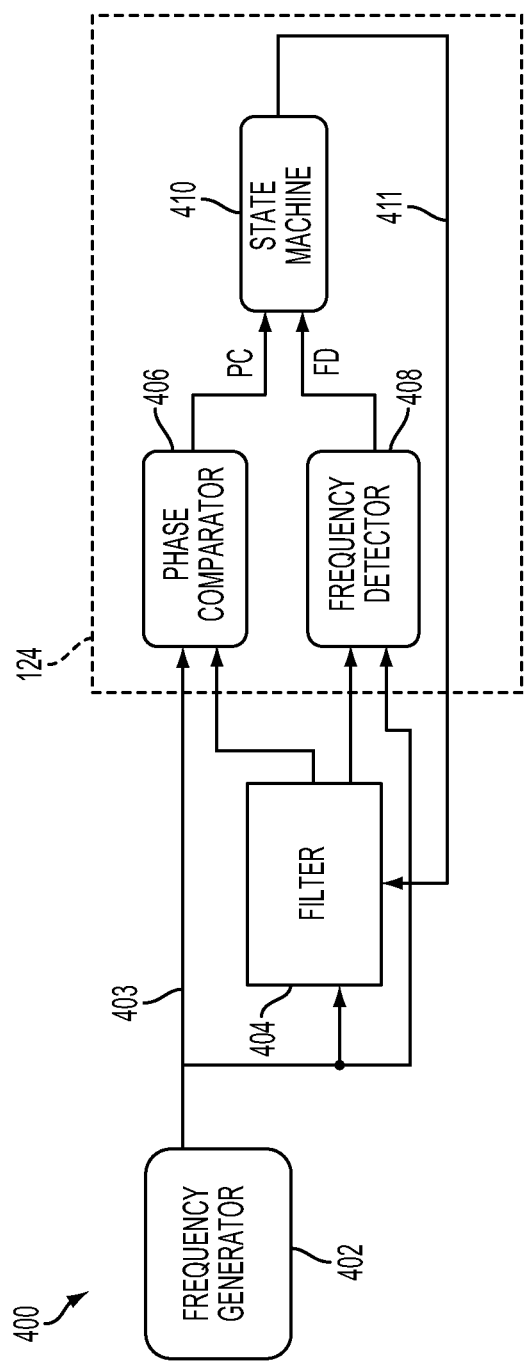
FIG. 4 is a schematic diagram showing an exemplary filter auto-calibration system that can be implemented using the multi clock generator of FIG. 3 according to some embodiments.

FIG. 4 is a schematic diagram showing an exemplary filter auto-calibration system 400 that can be implemented using the multi clock generator of FIG. 3 according to some embodiments. A frequency generator 402 (e.g., MCG 108) generates a signal (e.g., Fmc) at a frequency corresponding to a desired cutoff frequency of a core filter 404 (e.g., an RC filter in the filter module 118) to be calibrated. The desired cutoff frequency indicated by the signal provided by frequency generator 402 may be in the range from 1 to 10 MHz in some applications, for example. The output 403 of frequency generator 402 is provided as an input to core filter 404 and also as input to an auto-calibration control module 124. It should be understood by one of ordinary skill in the art that the output of frequency generator 402, i.e., signal 403, may be processed by an intermediate component preceding core filter 404 or the auto-calibration control module 124. In other words, signal 403 can be indicative of the desired cutoff frequency rather than having that cutoff frequency itself.

The auto-calibration control module 124 comprises a phase comparator 406, a frequency detector 408, and a state machine 410. A first input of state machine 410 is coupled to an output signal PC of phase comparator 406, and a second input of state machine 410 is coupled to an output signal FD of the frequency detector 408. An M-bit output signal 411 from state machine 410 is fed back to core filter 404 to calibrate. For example, state machine 410 may provide an M-bit capacitor code, e.g., a 7-bit BWC, to core filter 404 to update the capacitances of variable capacitors therein. The capacitor code may be decremented by a counter of the state machine 410, which may correspond to increasing a cutoff frequency of the core filter 404 from a minimum value of 2 MHz (or another value in the range between 1-10 MHz in embodiments, e.g., 1 MHz) until calibration is achieved or until a maximum value, e.g., 10 MHz, is reached.

For example, a 7-bit capacitor code may be decremented from an initial value of 127 until calibration is achieved, with the initial value of 127 corresponding to a frequency of 2 MHz and with frequency rising linearly, from 2 to 10 MHz, as the code is correspondingly decremented. Seven bits of the capacitor code are used in this example, to provide codes between 0 and 127. Suitable modification may enable to use a different number of bits for the capacitor code (or BWC) in other embodiments.

By decrementing a counter in this manner (i.e., increasing cutoff frequency from an initial value that is between 1 and 10 MHz), a desired cutoff frequency may be achieved faster than would be achieved by incrementing such a counter (decreasing such a cutoff frequency). When a predetermined condition is met, e.g., when an output signal from core filter 404 is locked to signal 403 in frequency and differs from signal 403 in phase by at least a predetermined offset, e.g., 90°, state machine 410 may freeze (capture) its count value, as that condition indicates that the core filter is calibrated to the desired RC time constant and the filter bandwidth is accordingly calibrated to the desired value.

Figure 5:
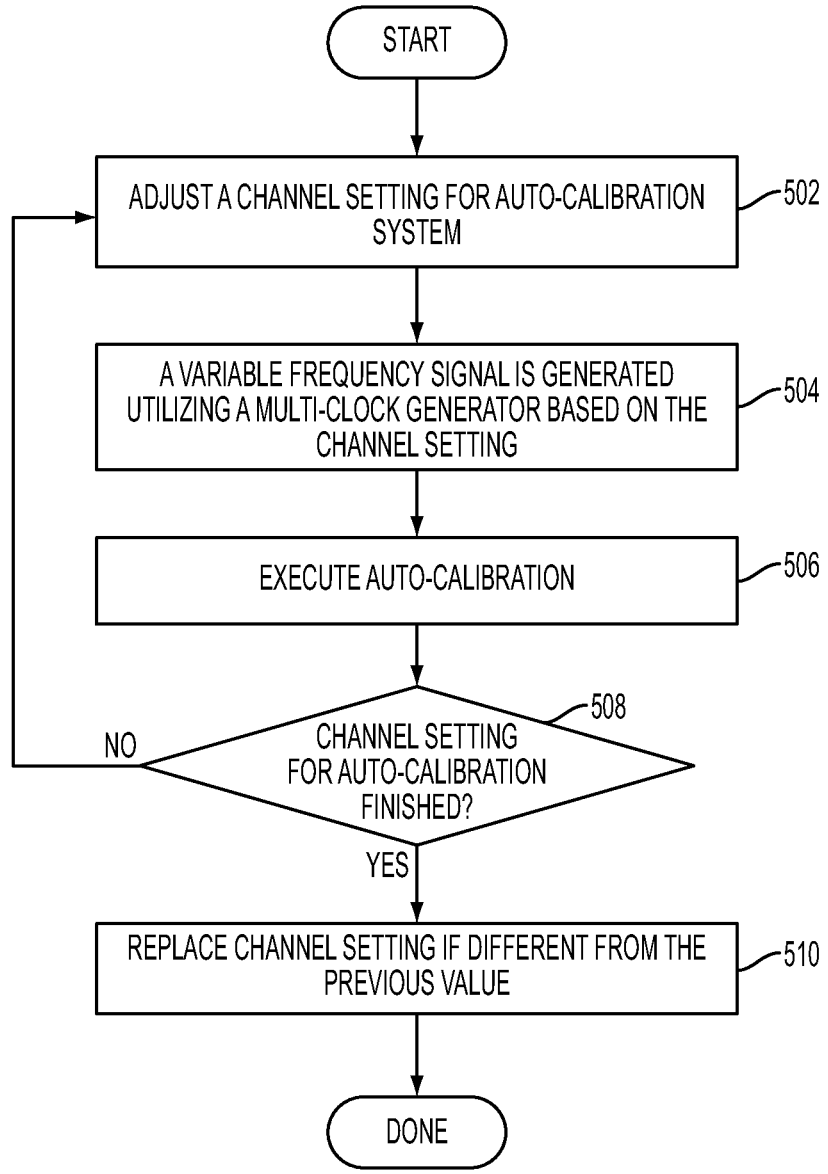
FIG. 5 is a flowchart for an exemplary method that can be implemented for the exemplary filter auto-calibration system of FIG. 1 and/or FIG. 4 according to some embodiments.

FIG. 5 is a flowchart for an exemplary method that can be implemented for the exemplary filter auto-calibration system of FIG. 1 and/or FIG. 4 according to some embodiments. At step 502, a channel setting for an auto-calibration system (e.g., 100 or 400) is adjusted. The channel setting controls the frequency synthesizer, e.g., 106, and the divider-by-N, e.g., 110. The channel setting can have associated BWC or capacitor code stored in a memory table. Due to PVT variations, the channel setting stored in the system may not be correct. Initially, the channel setting can be set to a value from a stored table for a desired filter bandwidth frequency.

At step 504, a first variable frequency signal, e.g., Fmc, is generated utilizing a multi-clock generator, e.g., 108, based on the channel setting. At step 506, the auto-calibration is executed as described previously. At step 508, it is determined whether a channel setting for the auto-calibration is finished, i.e., the desired filter frequency is obtained with the last channel setting. If so, the method continues to step 510 to replace the channel setting, if it is different from the previous value. In this case, the process is finished. If the desired filter frequency is not obtained with the last channel setting, the method goes back to adjust the channel setting for the auto-calibration system at step 502. In one exemplary simulation, the above process took less than 100 μsec.

The method can further include controlling a division number of a multi-modulus diver, e.g., 302, in the multi-clock generator, e.g., 108, based on the channel setting. The method can further include the multi-clock generator, e.g., 108, receiving a second variable frequency signal, e.g., Fsyn, from a frequency synthesizer, e.g., 106. The method can further include the frequency synthesizer, e.g., 106, receiving a reference frequency signal, e.g., Fxtal, from a local oscillator, e.g., 105, coupled to a crystal, e.g., 104. In some embodiments, the multi-clock generator, e.g., 108, receives the second variable frequency signal, e.g., Fsyn, from a multi-modulus divider, e.g., 212, in the frequency synthesizer, e.g., 106. The method can further include controlling a division number of the multi-modulus divider, e.g., 212, in the frequency synthesizer, e.g., 106, based on the channel setting.

According to some embodiments, a filter auto-calibration system includes a multi-clock module. The multi-clock module includes a multi-clock generator that generates a clock signal with a variable frequency based on a channel setting. There is at least one filter to be calibrated. An auto-calibration control module controls calibration of the at least one filter based on the channel setting. The multi-clock module is configured to supply the variable frequency clock signal to the at least one filter and to the auto-calibration control module, and the at least one filter is coupled to the auto-calibration control module.

According to some embodiments, a method for auto-calibrating a filter includes adjusting a channel setting of the auto-calibration for a desired filter bandwidth. A first variable frequency signal is generated utilizing a multi-clock generator based on the channel setting. Auto-calibration of the filter is executed. It is determined whether the desired filter bandwidth is achieved.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A filter auto-calibration system, comprising:
    a multi-clock module, including
        a multi-clock generator configured to generate a first variable frequency signal based on a channel setting, the multi-clock generator comprising a quadrature signal generator configured to generate an in-phase component and a quadrature component of the first variable frequency signal; and
        a mixer configured to generate an in-phase component and a quadrature component of a quadrature signal from a received signal other than the first variable frequency signal;
    at least one filter to be calibrated;
    an auto-calibration control module coupled to the multi-clock module and the at least one filter, the auto-calibration control module configured to receive the in-phase component and quadrature component of the first variable frequency signal from the multi-clock module, and configured to control calibration of the at least one filter based on the channel setting; and
    a switch coupled to the auto-calibration control module configured to selectively connect the multi-clock generator to the at least one filter in an auto-calibration mode to supply the in-phase component and quadrature component of the first variable frequency signal to the at least one filter and to connect the mixer to the at least one filter if the auto-calibration mode is complete.

2. The filter auto-calibration system of claim 1, wherein the multi-clock module further includes a frequency synthesizer that supplies a second variable frequency signal to the multi-clock generator based on the channel setting.

3. The filter auto-calibration system of claim 2, wherein the frequency synthesizer is a Sigma-Delta ($\Sigma\Delta$) fractional-N frequency synthesizer.

4. The filter auto-calibration system of claim 2, wherein the frequency synthesizer comprises a multi-modulus divider that is configured to divide an input signal frequency by a number that is controlled by the channel setting.

5. The filter auto-calibration system of claim 4, wherein the multi-modulus divider comprises a plurality of D flip-flops.

6. The filter auto-calibration system of claim 4, wherein the multi-modulus divider is arranged to supply the second variable frequency signal.

7. The filter auto-calibration system of claim 1, wherein the multi-clock generator comprises a multi-module divider.

8. The filter auto-calibration system of claim 7, wherein the multi-modulus divider comprises a plurality of D flip-flops and the multi-modulus divider is configured to divide an input signal frequency by a number that is controlled by the channel setting.

9. The filter auto-calibration system of claim 7, wherein the quadrature signal generator comprises two dividers-by-2.

10. The filter auto-calibration system of claim 7, wherein the quadrature signal generator comprises one divider-by-4.

11. A method for auto-calibrating a filter, comprising:
    determining a channel setting;
    generating a first variable frequency signal utilizing a multi-clock generator based on the channel setting;
    generating an in-phase component and a quadrature component of the first variable frequency signal using a quadrature signal generator;
    generating an in-phase component and a quadrature component of a quadrature signal from a received signal other than the first variable frequency signal using a mixer;
    executing auto-calibration of the filter by an auto-calibration control module coupled to the multi-clock generator, the multi-clock generator configured to supply the in-phase component and quadrature component of the first variable frequency signal to the auto-calibration control module and the filter;

causing, at least in part, a switch coupled to the auto-calibration control module to selectively connect the multi-clock generator and the filter during the auto-calibration to supply the in-phase component and quadrature component of the first variable frequency signal to the filter;

determining a desired filter bandwidth is achieved; and causing, at least in part, the switch to connect the mixer to the filter if the auto-calibration is complete.

12. The method of claim 11, further comprising repeating the auto-calibration if the desired filter bandwidth is not achieved.

13. The method of claim 11, further comprising replacing the channel setting if the channel setting is different from a previous value of the channel setting.

14. The method of claim 11, further comprising controlling a division number of a multi-modulus divider in the multi-clock generator based on the channel setting.

15. The method of claim 11, further comprising the multi-clock generator receiving a second variable frequency signal from a frequency synthesizer.

16. The method of claim 15, further comprising the frequency synthesizer receiving a reference frequency signal from a local oscillator coupled to a crystal.

17. The method of claim 15, wherein the multi-clock generator receives the second variable frequency signal from a multi-modulus divider in the frequency synthesizer.

18. The method of claim 17, further comprising controlling a division number of the multi-modulus divider in the frequency synthesizer based on the channel setting.

19. An integrated circuit including a filter auto-calibration system, the filter auto-calibration system comprising:

a multi-clock module including a multi-clock generator and a frequency synthesizer, wherein the frequency synthesizer is configured to supply a first variable frequency signal to the multi-clock generator based on a channel setting, the multi-clock generator is configured to generate a second variable frequency signal based on the channel setting, and the multi-clock generator comprises a multi module multi-modulus divider and a quadrature signal generator configured to generate an in-phase component and a quadrature component of the second variable frequency signal;

at least one filter to be calibrated; and an auto-calibration control module that is configured to control calibration of the at least one filter based on the channel setting, wherein the multi-clock module is configured to supply the in-phase component and quadrature component of the second variable frequency signal to the at least one filter via a switch in an auto-calibration mode, and the multi-clock module is configured to supply the in-phase component and quadrature component of the second variable frequency signal to the auto-calibration control module, and the at least one filter is coupled to the auto-calibration control module.

20. The integrated circuit of claim 19, wherein the multi-modulus divider comprises a plurality of D flip-flops that is configured to divide the first variable frequency signal from the frequency synthesizer by a number that is controlled by the channel setting.

* * * * *